United States Patent [19]

Mohammadi et al.

[11] Patent Number: 4,839,704
[45] Date of Patent: Jun. 13, 1989

[54] APPLICATION OF DEEP-JUNCTION NON-SELF-ALIGNED TRANSISTORS FOR SUPPRESSING HOT CARRIERS

[75] Inventors: Farrokh Mohammadi, Sunnyvale; Chin-Miin Shyu, San Jose, both of Calif.

[73] Assignee: National Semiconductor Corporation, Santa Clara, Calif.

[21] Appl. No.: 97,525

[22] Filed: Sep. 16, 1987

[51] Int. Cl.⁴ .................. H01L 29/78; H01L 29/06
[52] U.S. Cl. .................. 357/23.3; 357/23.9; 357/23.4; 357/20
[58] Field of Search .............. 357/23.3, 23.9, 23.4, 357/20

[56] References Cited

U.S. PATENT DOCUMENTS

| | | | |
|---|---|---|---|
| T954,008 | 1/1977 | Baitinger et al. | 357/23.3 |
| 4,532,698 | 8/1985 | Fang et al. | 357/23.3 |
| 4,729,001 | 3/1988 | Haskell | 357/23.4 |

Primary Examiner—Andrew J. James
Assistant Examiner—Robert P. Limanek
Attorney, Agent, or Firm—Limbach, Limbach & Sutton

[57] ABSTRACT

A structure and method of fabricating same is provided for a deep junction, non-self-aligned MOS transistor for suppressing hot carrier injection. According to the invention, dopant is introduced into a semiconductor substrate of a first conductivity type to form first and second spaced-apart substrate regions of opposite conductivity in the substrate. The first and second regions will become the source and drain regions of a deep junction, non-self-aligned MOS transistor having an effective channel length less than about 3.5 microns. The junction depth of the source and drain regions is greater than about 4000 Angstroms. Next, a layer of dielectric material is formed over the substrate. A region of conductive material is then formed over the dielectric material to serve as the gate of the MOS device. The resulting deep junction device has improved reliability as compared to self-aligned MOS devices of comparable effective channel length.

9 Claims, 6 Drawing Sheets

| CAPACITOR IMPLANT | GROUP 1<br>NONE | GROUP 2<br>Ph. 160 KeV.<br>3.5E15 | GROUP 3<br>Ph. 160 KeV.<br>2.5E13<br>& As. 160 KeV.<br>9E14 | GROUP 4<br>As. 160 KeV.<br>9E14 |
|---|---|---|---|---|
| 100/6 NMOS<br>Leff<br>VT<br>Gm (max.)<br>Isx max. (uA)@Vd = 10<br>Vg @ Isx max. | 5.988<br>0.722<br>98<br>408<br>4.6 | 3.329<br>0.637<br>174<br>137<br>4.4 | 4.405<br>0.666<br>132<br>76.1<br>4.1 | 4.66<br>0.684<br>125<br>413<br>4.4 |
| 100/8 NMOS<br>Leff<br>VT<br>Gm (max.)<br>Isx max. (uA)@Vd = 10<br>Vg @ Isx max. | 7.988<br>0.723<br>73.2<br>266<br>4.4 | 5.329<br>0.649<br>107<br>63<br>4.2 | 6.405<br>0.674<br>91.2<br>42.9<br>3.9 | 6.66<br>0.688<br>86.8<br>248<br>4.3 |

FIG. 5

APPLICATION OF DEEP-JUNCTION NON-SELF-ALIGNED TRANSISTORS FOR SUPPRESSING HOT CARRIERS

BACKGROUND OF THE INVENTION

1. Field of the Invention

The present invention relates to semiconductor integrated circuits and, in particular, to a method for fabricating deep junction MOS transistors which suppresses device degradation due to hot-carrier injection and, thus, increases long term reliability.

2. Background of the Invention

Hot-carrier induced device degradation is becoming of more concern in the long term reliability of MOS circuit operation as the feature sizes of individual MOS transistors shrink.

Charge carrier velocity saturation effects are observed in shallow diffusion MOS devices with small channel lengths (less than about 3.5 microns) because of the high electric field strengths that result between source and drain under typical operating conditions. In the case of N-channel devices, with increasing applied gate voltage, the surface depletion region of the device continues to widen until the onset of surface inversion as electrons are attracted to the channel surface to form the inversion layer. Under these conditions, the electric field is such that electrons accelerating from the source towards the high drain potential strike the device lattice, generating an electron/hole pair. A portion of the "hot" electrons generated under these conditions are absorbed at the drain because of its high positive potential. The holes travel to the substrate, creating a substrate current. At the same time, the electrons become accelerated to the extent that, attracted by the high gate potential, they can overcome the barrier that exists between the substrate and the gate oxide, forming a gate current.

Because the injection efficiency mechanism is almost three orders of magnitude larger for N-channel devices than for P-channel devices, the problems associated with hot carrier injection are dominant in NMOS devices.

As a consequence of hot electron injection, localized traps are generated at the silicon/silicon dioxide interface which degrade transconductance. This degradation of the carrier mobility results in an upward shift of the threshold voltage of the device. Over the stressing conditions of long term operation, this shift in the device threshold results in premature device malfunction.

While a desire for higher density and faster devices has resulted in the almost exclusive use of self-aligned, shallow diffusion processing techniques in the formation of MOS transistors, the above-described problem of device degradation which occurs in these devices as channel lengths shrink and with the application of high voltage, potentially exceeding the standard supply, has created a need for an alternative in those applications where long term reliability is required.

SUMMARY OF THE INVENTION

Accordingly, the present invention is directed to the realization by the inventors that deep junction transistors with small channel lengths of even less than about 3.5 microns suppress hot carriers, thus improving the long term reliability of devices with these feature sizes.

Deep junction transistors per se are not new. However, as stated above, as device feature sizes have shrunk, use of deep junction transistors has given way to the use of shallow diffusion, self-aligned structures in the interest of faster, higher density devices. The present invention takes advantage of the fact that in short channel MOS devices, the junction with the depletion layer is less abrupt in deep junction devices than in shallow diffusion devices. Therefore, for devices of equal effective channel length, the electric field in a deep junction device is expanded over a wider range, rather than being confined to a specific short range as is the case with shallow junction, self-aligned devices. This results in supression of hot carriers and improvement in device reliability as compared with a shallow diffusion device of equal effective channel length.

The formation of MOS capacitors requires a deep junction diffusion in the formation of the lower plate of the capacitor. A preferred embodiment of the present invention takes advantage of this step in MOS capacitor fabrication to simultaneously provide the deep junction source and drain diffusions useful in suppressing hot carriers in short-channel MOS transistors. Although the deep junction devices so formed are non-self-aligned, they can be fabricated without expansion of conventional process flow prior to the formation of the self-aligned devices, if such devices are desired.

According to a preferred embodiment of the present invention, a method is provided for fabricating a novel deep junction, non-self-aligned NMOS transistor structure while simultaneously fabricating an MOS capacitor. According to this method, phosphorus atoms are implanted into three surface areas of a P-type semiconductor substrate to form first, second and third spaced-apart substrate regions of N-type conductivity. The first N-type region will become the lower plate of the MOS capacitor. The second and third N-type regions will become the source and drain regions of the deep junction, non-self-aligned NMOS transistor. A layer of gate oxide is then formed on the surface of the substrate. Next, a layer of conductive material, preferably polycrystalline silicon, is formed over the gate oxide layer and patterned such that a first polysilicon region is formed above the first N-type substrate region and a second polysilicon region is formed overlying the channel region between the second and third N-type substrate regions. The first polysilicon region serves as the upper plate of the MOS capacitor. The second polysilicon region serves as the gate of the deep junction, non-self-aligned NMOS transistor.

Other objects, advantages and features of the present invention will become apparent and be appreciated by referring to the detailed description of the invention provided below which should be considered in conjunction with the accompanying drawings.

BRIEF DESCRIPTION OF THE DRAWINGS

FIG. 5 is a table which provides the process and electrical parameters for devices used in the testing of the present invention.

DETAILED DESCRIPTION OF THE INVENTION

According to a preferred embodiment of the present invention, a deep junction, non-self-aligned NMOS device is formed simultaneously with the fabrication of an MOS capacitor, the resulting structure having application, for example, in EROM devices.

Figure 1:
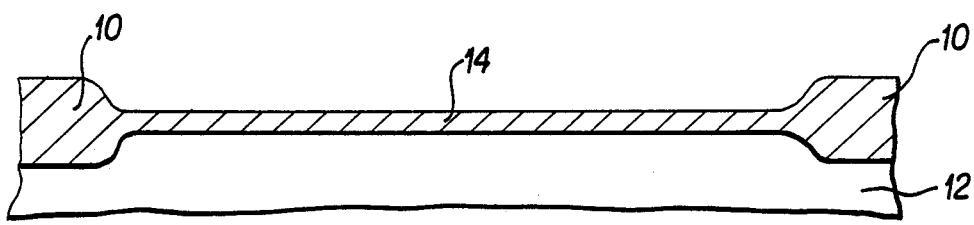
FIG. 1 is a cross-sectional view illustrating a P-type semiconductor substrate with a layer of "pad" oxide remaining on the surface of the substrate.

FIG. 1 shows a semiconductor substrate 12 of P-type conductivity after field oxide regions lo have been grown by conventional techniques to define isolated composite regions in the surface of the substrate. A layer of silicon dioxide 14, or "pad" oxide, about 400-500 Angstroms thick remains on the surface of the substrate 12 following definition of field oxide regions 10.

Figure 2:
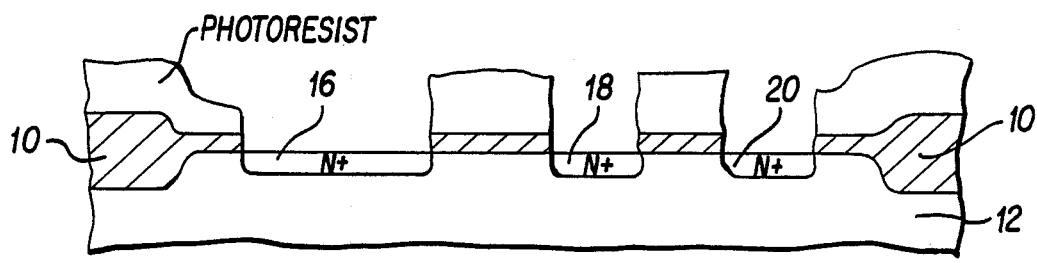
FIG. 2 is across-sectional view illustrating the formation of N+ diffusion regions in the substrate.

As shown in FIG. 2, silicon dioxide layer 14 is then masked with a layer of photoresist and etched according to conventional techniques to expose surface areas of the P-type substrate 12. An N-type dopant, preferably phosphorus atoms, is then implanted into the substrate 12 through the exposed surface areas to form a first N+ diffusion region 16, which will serve as the lower plate of an MOS capacitor, and second and third N+ diffusion regions 18 and 20, which will serve as the source and drain regions of a deep junction, non-selfaligned NMOS device. The phosphorus is implanted at a dosage of $3.5 \times 10^{15}/cm^2$ at 160 KeV to an initial depth of about 2000 Angstroms. Phosphorus dopant is preferred to other N-type dopants, such as arsenic, because its faster diffusion rate will more readily provide the desired deep junctions.

Following the initial phosphorus implant, the pad oxide is removed. Next, a layer 22 of silicon dioxide or gate oxide is grown in a conventional manner over the surface of substrate 12. In this example, the thickness of the gate oxide layer 22 above the non-implanted regions of substrate 12 is about 400 Angstroms. Due to the difference in substrate characteristics resulting from the phosphorus implant, the thickness of the oxide layer 22 overlying N-type regions 16, 18 and 20 is thicker, i.e. about 550-650 Angstroms. The corresponding thickness of the field oxide regions 10 is about 0.5-0.6 microns.

Figure 3:
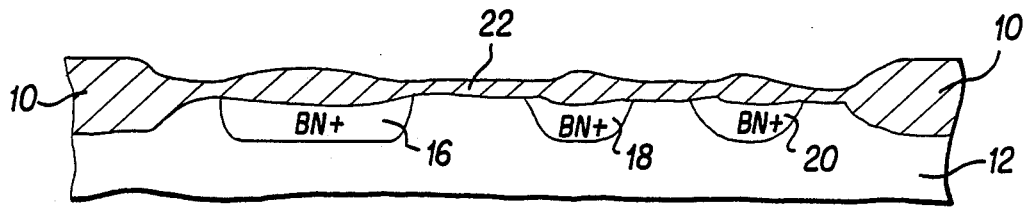
FIG. 3 is a cross-sectional view illustrating the formation of a gate oxide layer on the surface of the substrate.
Figure 4:
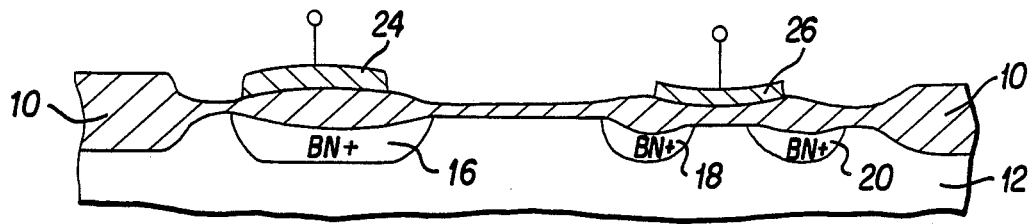
FIG. 4 is a cross-sectional view illustrating the formation of polysilicon regions to define the upper plate of an MOS capacitor and the gate of a deep junction, non-self-aligned NMOS transistor.

As further shown in FIG. 3, simultaneously with the formation of the gate oxide layer 22, the N-type dopant diffuses to the desired deep junction depth of about 0.5-1.4 microns as measured from the lower surface of the gate oxide layer 22. Lateral diffusion of phosphorous during the formation of the gate oxide results in an effective channel length between regions 18 and 20 of about 3.5 microns.

(It should be understood that the example described is not to be considered as limiting. First, other N-type dopants such as arsenic or a combination of arsenic and phosphorus can be utilized. Second, deep junction devices having source/drain junction depths of about 4000 Angstroms or more and effective channel lengths less than about 3.5 microns can be fabricated in accordance with the present invention which exhibit the desired hot carrier suppression characteristics as compared to shallow diffusion, selfaligned devices of similar geometry.)

Next, conventional techniques are utilized to form a layer of polycrystalline silicon over the gate oxide layer and to mask and etch the polysilicon layer to define the upper plate 24 of the MOS capacitor as well as the non-self-aligned gate 26 of the deep junction NMOS device.

Vias (not shown) are then formed in the gate oxide layer to provide contacts to the lower plate 16 of the MOS capacitor as well as to the source and drain regions 18 and 20 of the deep junction NMOS device. Ohmic contacts are also made to the upper plate 24 of the capacitor and to the gate 26 of the NMOS transistor.

While not shown in the drawings, it should be clear to those skilled in the art that self-aligned-NMOS devices may be formed in the same composite region with the deep junction device by forming additional polysilicon regions, utilizing the gate regions as a mask to expose source and drain regions for the self-aligned devices and implementing an additional shallow n+ diffusion to form the self-aligned NMOS devices.

Tests have been conducted to compare the reliability of deep junction, non-self-aligned NMOS devices fabricated as described above with conventional self-aligned NMOS devices. A brief summary of the process and electrical parameters of the devices utilized in the tests is provided in FIG. 5. Devices in Group 1 are the conventional self-aligned transistors; devices in Groups 2, 3 and 4 are deep junction, non-self-aligned devices in accordance with the present invention. A DC condition was used to stress the transistors. As stated above, the hot electron effect on an NMOS transistor increases with the substrate current. In order to get the maximum hot electron effect at 10 Volt operation, the stress condition was set at VD=10 Volts and VG at where the substrate current was maximum.

Figure 6:
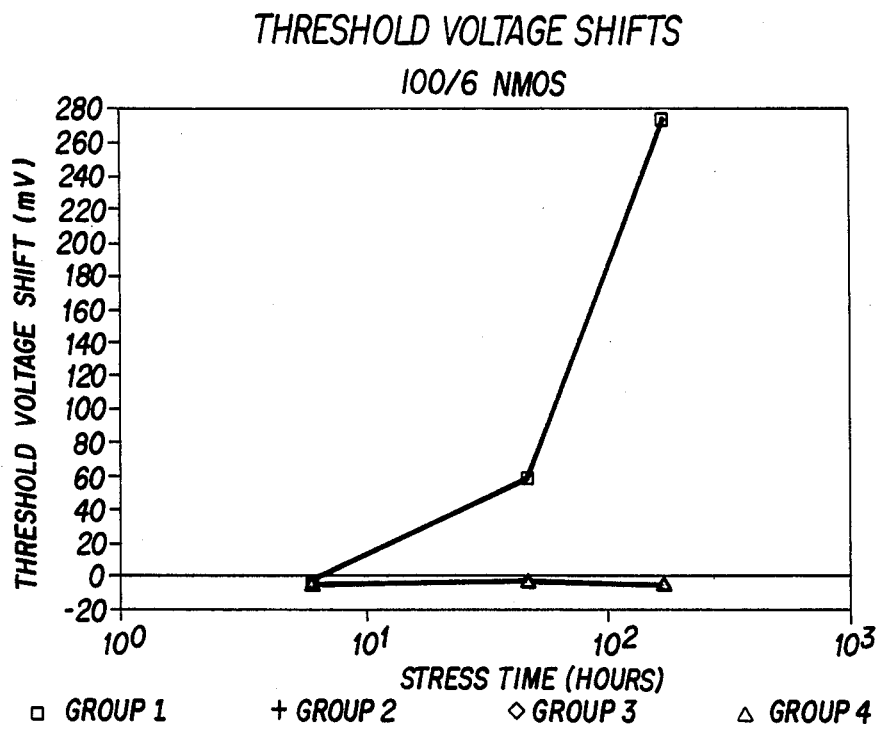
FIG. 6 is a graph illustrating a comparison of threshold voltage shifts for 100/6 self-aligned and non-self-aligned NMOS transistors after high voltage stress.
Figure 7:
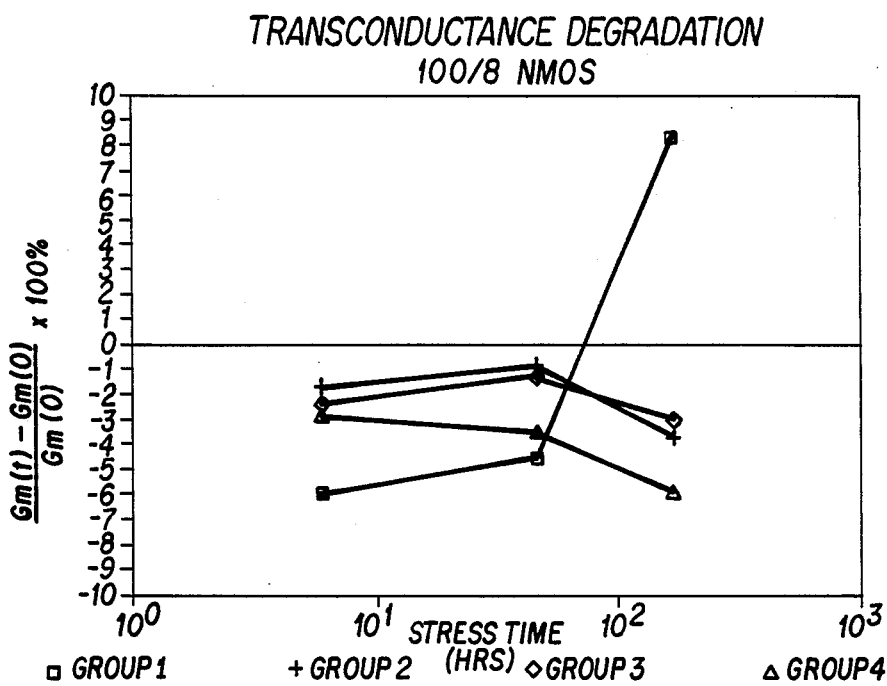
FIG. 7 is a graph illustrating a comparison of transconductance degradation for 100/6 self-aligned and non-self-aligned NMOS transistors after high voltage stress.

In this experiment, 7 or 8 devices from each group were stressed at the same time. The average threshold voltage (VT) shifts and the transconductance (Gm) degradations for 100/6 NMOS devices from each of Groups 1-4 are plotted in FIGS. 6 and 7, respectively. ("100/6" refers to the channel width/channel length as drawn.)

The test results show that the threshold voltage of the self-aligned devices shifted 273 mV after 169.4 hrs.; the threshold voltage of the deep junction devices shifted only 5–7 mV over the same time period. The transconductances of the non-self-aligned devices have less effect at high voltage stress than that of the self-aligned devices, except for the inexplicable Group 1 data measured at 169.4 hours and shown in FIG. 7.

Figure 8:
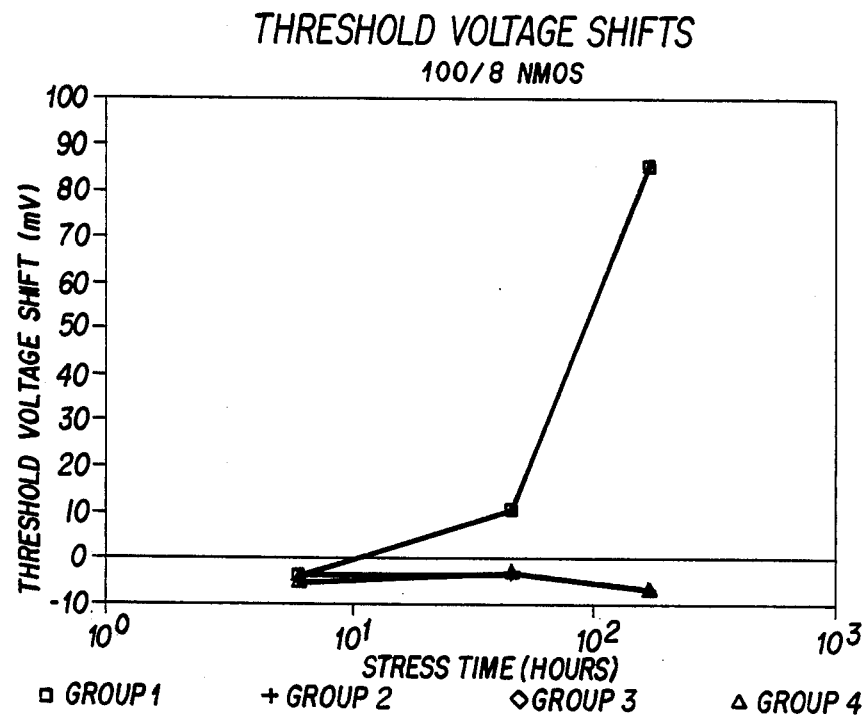
FIG. 8 is a graph illustrating a comparison of threshold voltage shifts for 100/8 self-aligned and non-self-aligned NMOS transistors after high voltage stress.
Figure 9:
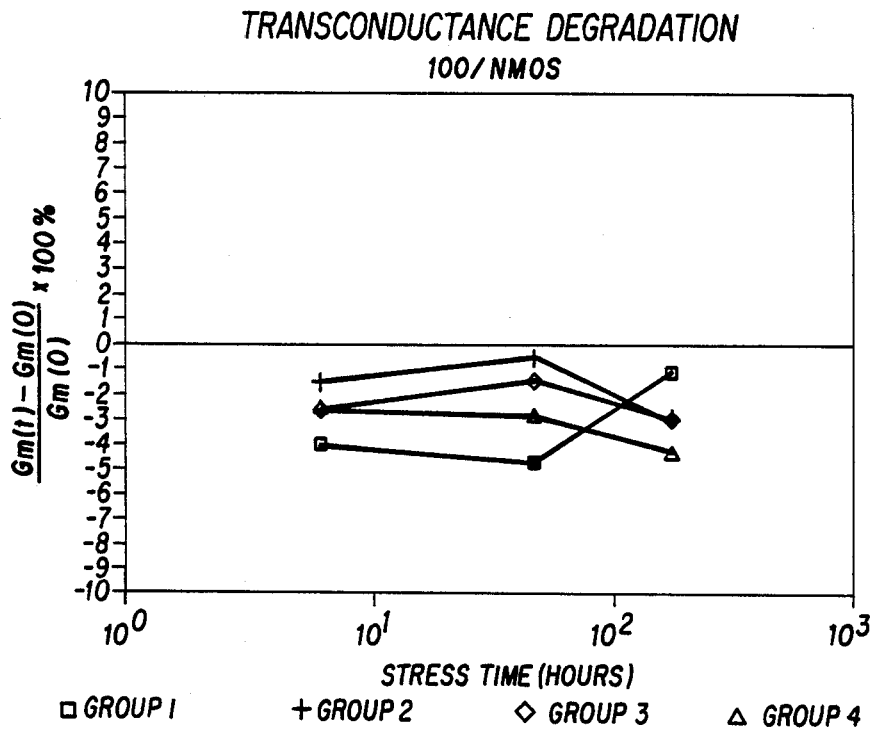
FIG. 9 is a graph illustrating a comparison of transconductance degradation for 100/8 self-aligned and non-self-aligned NMOS transistors after high voltage stress.
Figure 10:
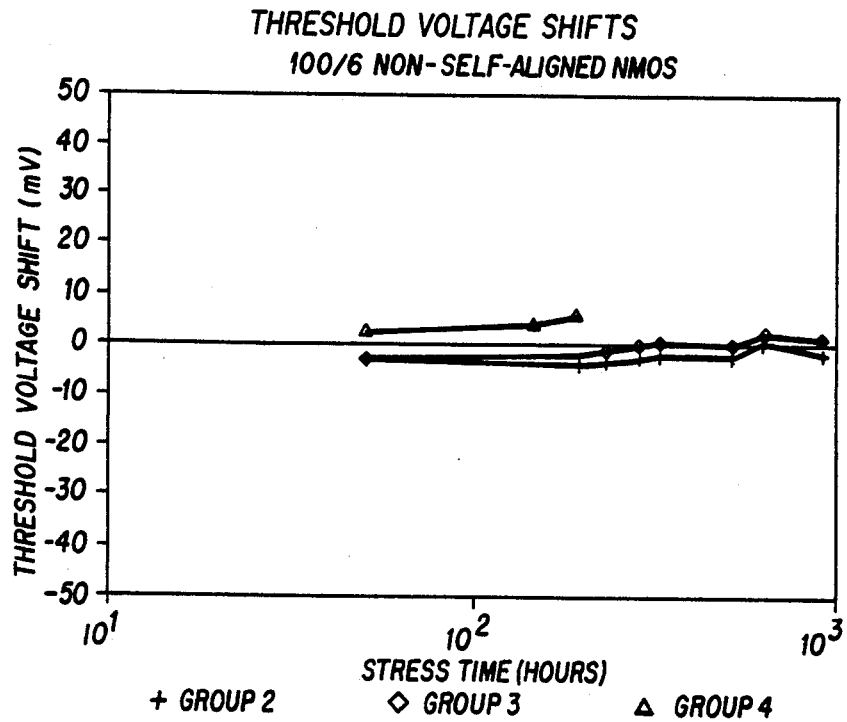
FIG. 10 is a graph illustrating threshold voltage shift for 100/6 non-self-aligned NMOS transistors after long term high voltage stress.
Figure 11:
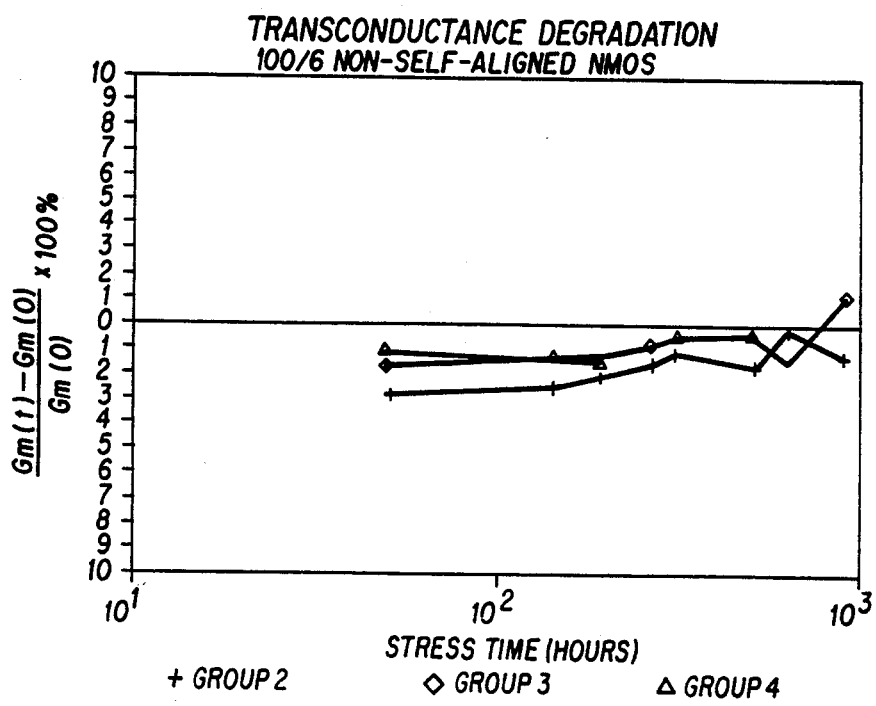
FIG. 11 is a graph illustrating transconductance degradation for 100/6 non-self-aligned NMOS transistors after long term high voltage stress.
Figure 12:
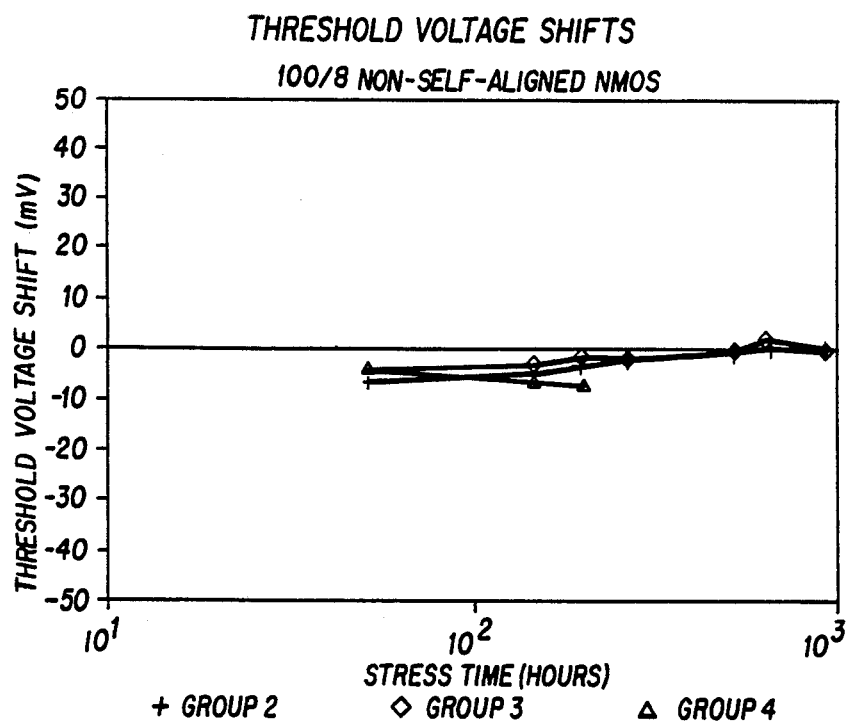
FIG. 12 is a graph illustrating threshold voltage shift for 100/8 non-self-aligned NMOS transistors after long term high voltage stress.
Figure 13:
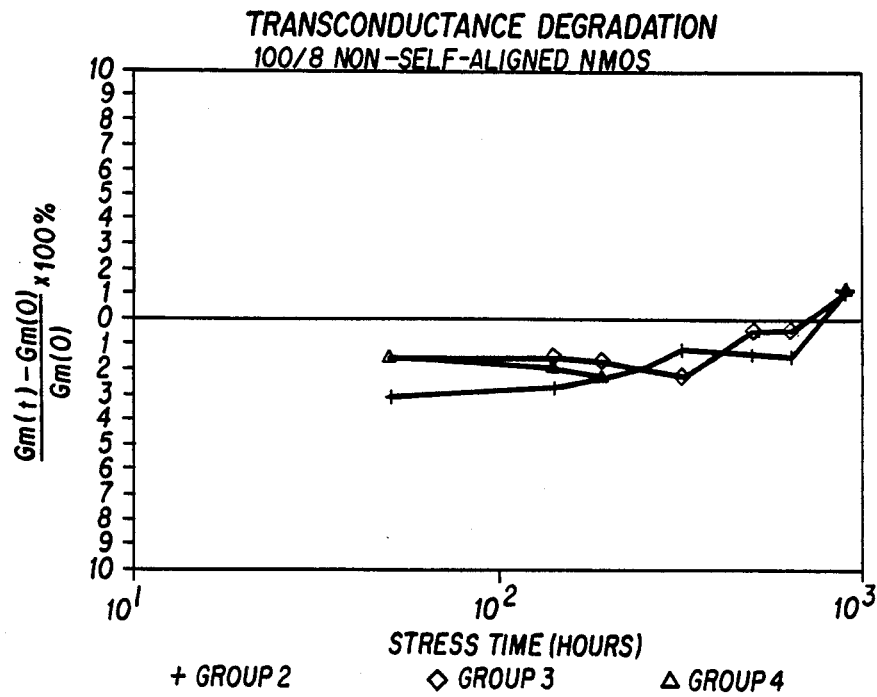
FIG. 13 is a graph illustrating transconductance degredation for 100/8 non-self-aligned transistors after long term high voltage stress.

The test results demonstrate that the 100/6 self-aligned transistors suffer from the hot electron effect at 10 Volt operation, while the deep junction, non-self-aligned transistors do not. Similar data for 100/8 transistors is plotted in FIGS. 8 and 9.

FIGS. 10–13 show the results of the threshold voltage shifts and transconductance degradations on the non-self-aligned devices (both 100/6 and 100/8) after long term stress (914.5 hours). The results indicate that the hot electron effect on these devices can be ignored.

It should be understood that various alternatives to the embodiment of the invention described herein may be employed in practicing the invention. It is intended that the following claims define the scope of the invention and that the structure and methods within the scope of these claims and their equivalents be covered thereby.

What is claimed is:

1. A deep junction MOS transistor for suppressing hot carrier injection comprising:
   (a) first and second spaced apart regions of a first conductivity type formed in a semiconductor substrate of a conductivity type opposite to the first conductivity type to define a channel region therebetween, the effective channel length being less than about 3.5 microns, the junction depth of the first and second regions being greater than about 4000 Angstroms;
   (b) a layer of dielectric material formed on the channel region;
   (c) a region of conductive material formed on the layer of dielectric material overlying the channel region, wherein the region of conductive material forms a non-self-aligned gate of the transistor.

2. A deep junction MOS transistor as in claim 1 wherein the first conductivity type is N-type.

3. A deep junction MOS junction transistor as in claim 2 wherein the effective channel length is about 3.3 microns.

4. A deep junction MOS transistor as in claim 3 wherein the junction depth is about 0.5–1.4 microns.

5. A deep junction MOS transistor as in claim 1 wherein the conductive material is polysilicon.

6. Integrated circuitry comprising
   (a) first, second and third spaced-apart regions of N-type conductivity formed in a semi-conductor substrate of P-type conductivity, the first N-type region defining the lower plate of an MOS capacitor, the second and third N-type regions defining the source and drain regions, respectively, of an MOS transistor and further defining a channel region therebetween, the effective channel length being less than about 3.5 microns, the junction depth of the second and third regions being greater than about 4000 Angstroms;
   (b) a layer of dielectric material formed on the substrate overlying the first, second and third N-type regions;
   (c) first and second regions of conductive material formed on the dielectric material overlying the first N-type region and the channel region, respectively, wherein the second region of conductive material forms a non-self-aligned gate of the MOS transfer.

7. Integrated circuitry as in claim 6 wherein the effective channel length is about 3.3 microns.

8. Integrated circuitry as in claim 7 wherein the junction depth is about 0.5–1.4 microns.

9. Integrated circuitry as in claim 8 wherein the dielectric material comprises an oxide of silicon and the first and second regions of conductive material comprise polysilicon.

* * * * *

UNITED STATES PATENT AND TRADEMARK OFFICE
CERTIFICATE OF CORRECTION

PATENT NO. : 4,839,704

DATED : June 13, 1989

INVENTOR(S) : Mohammadi et al.

It is certified that error appears in the above-identified patent and that said Letters Patent is hereby corrected as shown below:

Col, 5, line 37, after "the" and before "channel" insert --substrate overlying the first and second regions and the--.

Col. 6, line 5, delete "junction" (second occurrence).

Col. 6, line 14, "semi-conductor" should be --semiconductor--.

Signed and Sealed this

Twentieth Day of March, 1990

Attest:

JEFFREY M. SAMUELS

Attesting Officer

Acting Commissioner of Patents and Trademarks